US 6,680,851 B1

(12) United States Patent
Fasullo et al.

(10) Patent No.: US 6,680,851 B1
(45) Date of Patent: Jan. 20, 2004

(54) POSITIVE LATCHING COMBINATION HANDLE AND INSERTION/REMOVAL TOOL METHOD AND APPARATUS

(75) Inventors: Gregory H. Fasullo, Dallas, TX (US); Donald P. Rearick, Rowlett, TX (US); James R. Walton, Terrell, TX (US)

(73) Assignee: Valere Power, Inc., Richardson, TX (US)

( * ) Notice: Subject to any disclaimer, the term of this patent is extended or adjusted under 35 U.S.C. 154(b) by 0 days.

(21) Appl. No.: 10/231,630

(22) Filed: Aug. 30, 2002

(51) Int. Cl.[7] .............................. H05K 7/12; H05K 7/16
(52) U.S. Cl. ..................... 361/740; 361/732; 361/801; 361/747; 361/759
(58) Field of Search ............................. 361/732, 740, 361/726, 759, 801, 747; 439/142; 312/215, 216, 222

(56) References Cited

U.S. PATENT DOCUMENTS

| | | | |
|---|---|---|---|
| 4,313,150 A | * | 1/1982 | Chu ........................... 361/399 |
| 4,821,145 A | * | 4/1989 | Corfits et al. ............... 361/383 |
| 4,821,146 A | * | 4/1989 | Behrens et al. ............. 361/383 |
| 4,947,289 A | * | 8/1990 | Dynie ........................ 361/415 |
| 4,996,631 A | * | 2/1991 | Freehauf .................... 361/415 |
| 5,946,196 A | * | 8/1999 | Baek ........................... 361/798 |
| 6,067,225 A | * | 5/2000 | Reznikov et al. ........... 361/685 |
| 6,222,736 B1 | * | 4/2001 | Sim et al. .................... 361/727 |
| 6,356,441 B1 | * | 3/2002 | Claprod ....................... 361/685 |
| 6,515,854 B1 | * | 2/2003 | Claprod ....................... 361/685 |

OTHER PUBLICATIONS

Richco document "Card Guides and Pullers," date unknown.

* cited by examiner

Primary Examiner—David Martin
Assistant Examiner—Dameon E. Levi
(74) Attorney, Agent, or Firm—Carr LLP

(57) ABSTRACT

Disclosed is a leveraged handle apparatus which may alternatively be used as an ordinary latching and locking device for a hinged door to an enclosed area or as an insertion/extraction device for easily inserting or extracting an electronic module or other container from an enclosure where electrical pins may be damaged by improper insertion techniques, and/or the insertion/extraction forces may be more than can be conveniently provided by a technician. The outer surface of the handle and an associated latch may be flush with the other outer surfaces when the door is closed or the container is fully inserted in the enclosure. When the handle is in an unlatched condition, a spring mechanism is used to encourage the handle toward a fully open position for ease in using a finger pull for extracting or otherwise handling the object to which the handle is attached.

27 Claims, 3 Drawing Sheets

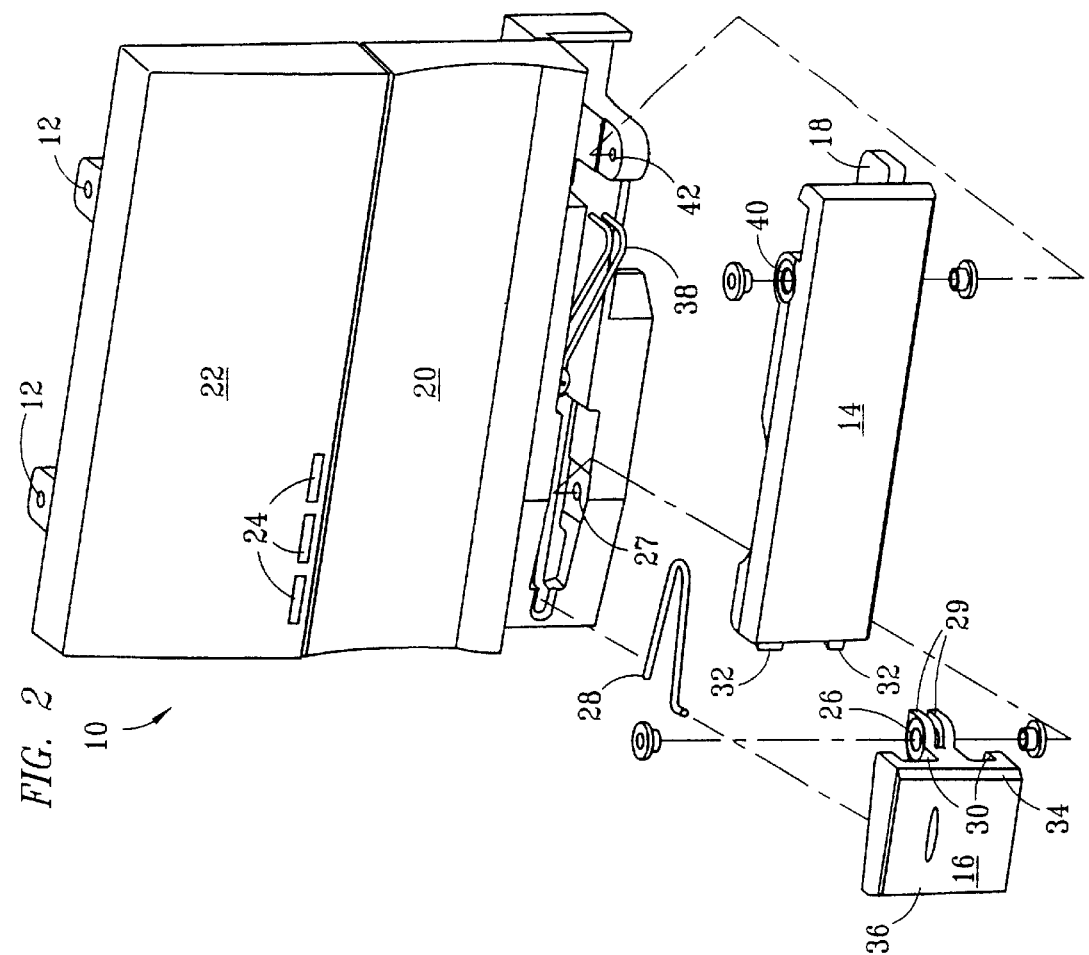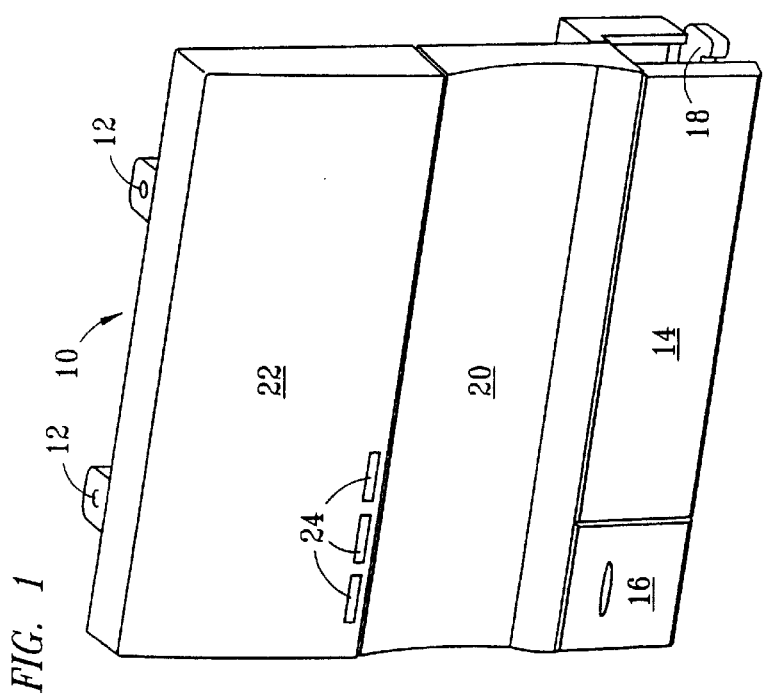

POSITIVE LATCHING COMBINATION HANDLE AND INSERTION/REMOVAL TOOL METHOD AND APPARATUS

TECHNICAL FIELD

The present invention relates in general to an electronic module insertion and extraction lever that can be securely latched and locked in place to prevent opening from high pressure forces applied thereto.

BACKGROUND

When a device such as an electronic module is inserted into a rack, it may take a considerable insertion force to mate the electrical contacts on the module and complementary contacts in the rack. To prevent accidental pin destruction, such insertion forces have, in many prior art instances, been accomplished by a lever arm having a fulcrum on either the rack or the module, acting to apply force to the module and move it with respect to the rack. It is important that the module be inserted completely into position to make sure all electrical contacts are operable. Once the module is inserted, it is important that the module be securely locked in place to prevent unintentional partial or full removal of the module from the rack due to outside forces, such as earthquakes and so forth. Various mechanisms, such as screws, have been used to provide such a locking action. In such instances, separate tools are required to both lock and unlock the module subsequent to insertion and prior to extraction, respectively.

Many of these prior art lever arm insertion/extraction devices have required considerable operational space outside the dimensions of the module being inserted, whereby packing density of modules in a rack is adversely compromised.

It would be desirable to have an insertion/extraction device which includes a locking mechanism and may be used to provide insertion and extraction forces where needed while minimizing operational space required for these actions outside the physical dimensions of a door or module with which the handle is being used.

SUMMARY OF THE INVENTION

The foregoing disadvantages are overcome by the present electrical module insertion/extraction device which is mountable to a rack and adapted for holding at least one module and which includes pivoted lever having a power arm and a resistance insertion arm for applying insertion force to the module and a camming lever surface for applying an extraction force to the module and a locking mechanism for maintaining said the module in an inserted position.

BRIEF DESCRIPTION OF THE DRAWINGS

For a more complete understanding of the present invention, and its advantages, reference will now be made in the following Detailed Description, to the accompanying drawings, in which:

FIG. 1 is an isometric view of the handle and lock incorporated in a facing or faceplate for use with a container to be mounted in an enclosure;

FIG. 2 provides an exploded view of the handle and locking lever portion of FIG. 1;

DETAILED DESCRIPTION

Figure 3:
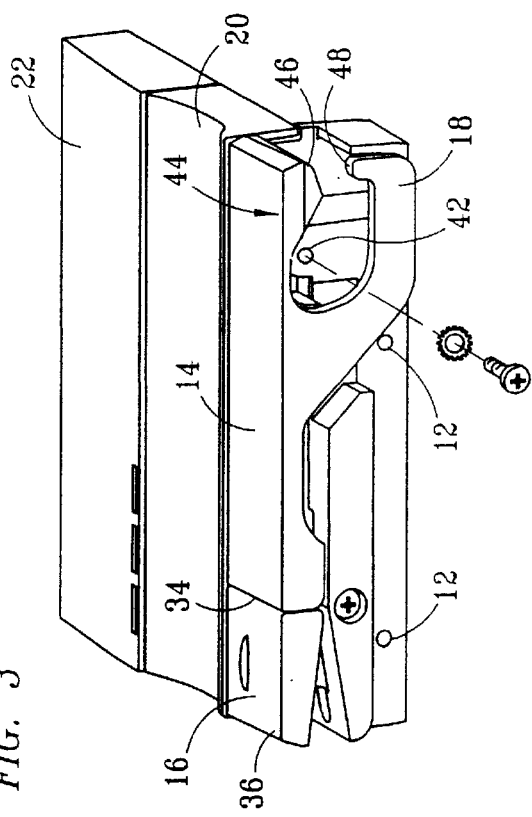
FIG. 3 provides a view of the apparatus of FIG. 1 from beneath.

In the following description of the drawings, the same designators may be used, where appropriate, in different figures.

In FIG. 1, a faceplate generally designated as 10 is shown having an opening 12 for use in mounting the faceplate to an electronic module or other container to be inserted into an enclosure. An outer surface is shown of a lever insertion/extraction handle 14. Also shown adjacent handle 14 is an outer surface of a locking button or latching lever device 16. The end of an insertion arm 18 is also visible in this view. The faceplate 10 further includes a slightly curved central portion 20 and an upper portion 22 having indicator light openings 24. It may be noted further that the outer surfaces of the handle 14 and lock 16 are generally flush or coplanar with the remaining portions 20 and 22 of faceplate 10.

In FIG. 2, additional details are shown for the handle 14 and the lock 16. An opening 26 in lock 16 comprises a fulcrum or pivot point for this device with respect to a mounting point 27 in the faceplate 10. A spring or resistance means 28 is positioned between a base point of faceplate 10 and lock 16 to exert outward pressure on this lever arm. Projections 29 act as a stop to prevent the lock. 16 from opening (raising) more than a given amount. Openings or cavities 30 are complementary in size to receive beveled projections 32 of handle 14 when the handle is in a locked position, as shown in FIG. 1. A slightly beveled or rounded portion 34 of lock 16 is substantially immediately above the fulcrum 26, whereby downward pressure of the handle 14 engages the beveled projections 32 with edge 34 to move an end portion 36 of lock 16 toward faceplate 10 against the resistance spring 28. The projections 29 operate to keep the beveled edge 34 from moving to the right beyond a beveled edge 54 of projections 32, as may be seen from FIG. 5, to be later discussed.

When the handle 14 is sufficiently depressed, the projections 32 enter cavities 30 to lock the handle 14 in place. As will be later discussed, the handle 14 includes a spring mechanism 38, which maintains pressure to encourage the handle 14 toward an open position. The beveled edge 54 of projections 32 may be better seen in FIG. 5. A slight pressure against the end 36 of lock 16 will move the lever arm lock 16 about the fulcrum 26 so as to allow the projections 32 to be disengaged from the cavities 30 and the handle 14 to move to an unlocked position. As may be further observed, the handle operates around a fulcrum opening 40 and a mounting point 42 of base faceplate 10.

In FIG. 3, an extraction arm 44 is shown comprising a part of handle 14. The arm 44 includes a curved or rounded portion 46, which acts as a cam in the process of extracting a container from an enclosure. The insertion arm 18 includes a similar rounded cam portion 48. These two arms provide a resistance portion of the lever handle 14 while power or pressure is applied to the other end of the handle 14 near projections 32 to operate the lever in the insertion and extraction operations. Further faceplate mounting holes 12 are also shown on the bottom of faceplate 10.

Figure 4:
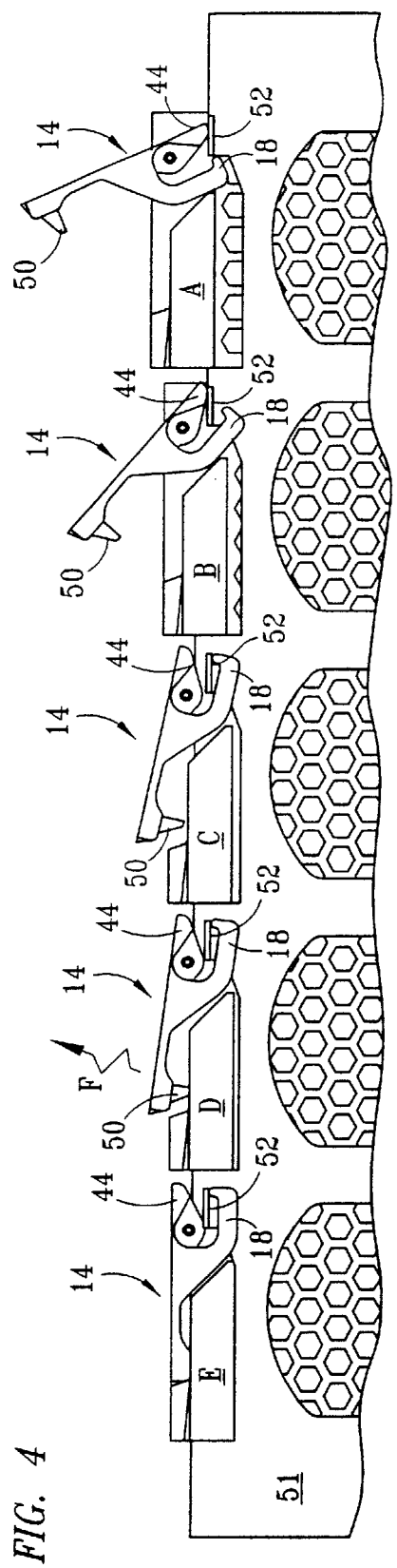
FIG. 4 illustrates a bottom view of a rack containing a plurality of containers using the present invention in various stages of insertion/extraction of the container with respect to the rack enclosure space.

In FIG. 4, in combination with FIG. 3, a finger pull 50 is shown on an inner surface of several of the handles 14. As explained previously, several containers A, B, C, D and E are shown from a lower view of a rack 51 in various stages of insertion or extraction. A plurality of enclosure projections or stops 52 are also shown in the drawing. These projections 52 provide a surface against which the cams 46 and 48 operate against in the respective extraction and insertion actions. Although projection 52 extends outwardly from the enclosure to minimize the size of the enclosure, the projection may also project inwardly of the enclosure with appropriate enclosure and module design. Further, as shown with respect to container "E", the interaction of cam 48 of arm 18 and the projection 52 prevents the removal of the container when the handle is in a locked position as shown. Additionally, as shown with respect to container "E", arm 18 extends underneath the rack 51 thereby providing container retention perpendicular to the insertion direction.

It may be further observed that, when the handle 14 is in a fully open position, as shown for container "A", the container cannot be fully inserted into the enclosure of rack 51 because the extraction arm 44 and the projection 52 interfere with such an action. In other words, the arms on the handle must be used in the insertion mode to fully insert a container in the rack 51. Although not specifically shown, it will be apparent that the container cannot be inserted at a time when the handle 14 is in the locked position because the insertion arm 18 and the projection 52 prevent such an action.

From observation of FIG. 4, in combination with FIGS. 2 and 3, it may be noted that container "E" is in a fully locked position. When the handle 14 is released by lock 16, the spring force 38 opens the handle until surface 46 hits projection 52, thus providing access to the finger pull 50 for applying force "F" to extract the container. When a force "F" is applied to handle 14 of container "D", cam 46 of arm 44 will apply a force against projection 52 to cause the container to be extracted. This process is shown completed for container "A".

The insertion process starts when the module is pushed in slightly from the position shown as module "A" so that cam 48 of arm 18 contacts the inside of projection 52. As a closing force is applied to handle 14, cam 48 slides from left to right while the lever action between cam 48 and a fulcrum opening or pivot point 40 provides insertion forces for the mating contacts on the module. As shown with respect to module "E", the cam 48 is fully to the right side of projection 52 when the module is fully inserted. It should also be noted that, since arm 18 is on one side of the rack 51 and the module, to which the handle 14 is attached, is on the other side of the rack, vertical movement (earthquake vibration forces or otherwise) of the module is prevented.

Figure 5:
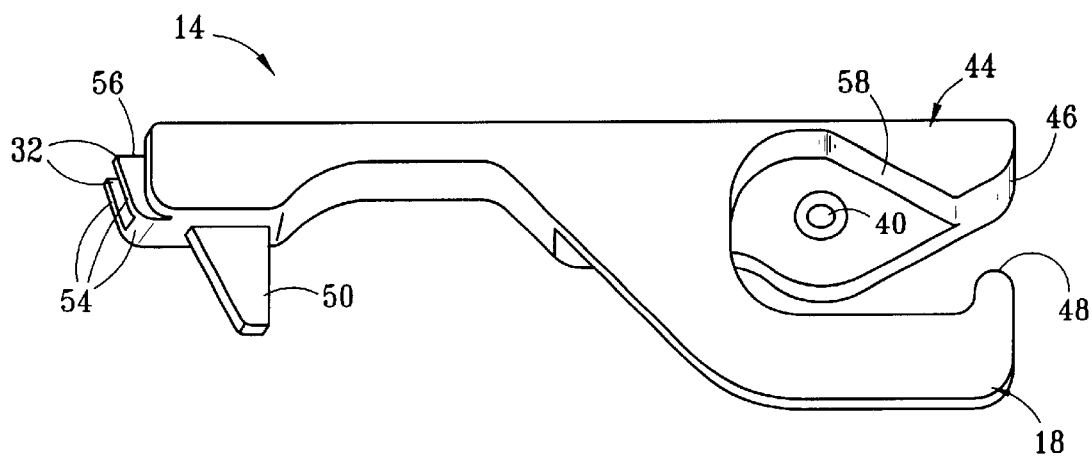
FIG. 5 is an isometric view of just the handle.

In FIG. 5, a beveled edge 54 of projections 32 is more clearly shown. An upper edge 56 of the projections 32 is shown to be substantially parallel with a plane formed by the outer surface of handle 14. If a slightly more positive locking action is desired, the edge 56 can be slightly angled whereby the points of the projection are closer to a plane described by the outer surface of handle 14 than is the base of edge 56. A surface area 58 stops or limits the opening of the handle 14 beyond the angle shown for container "A" in FIG. 4 when surface area 58 contacts the side of the projection containing pivot point 42 of FIG. 2.

Figure 6:
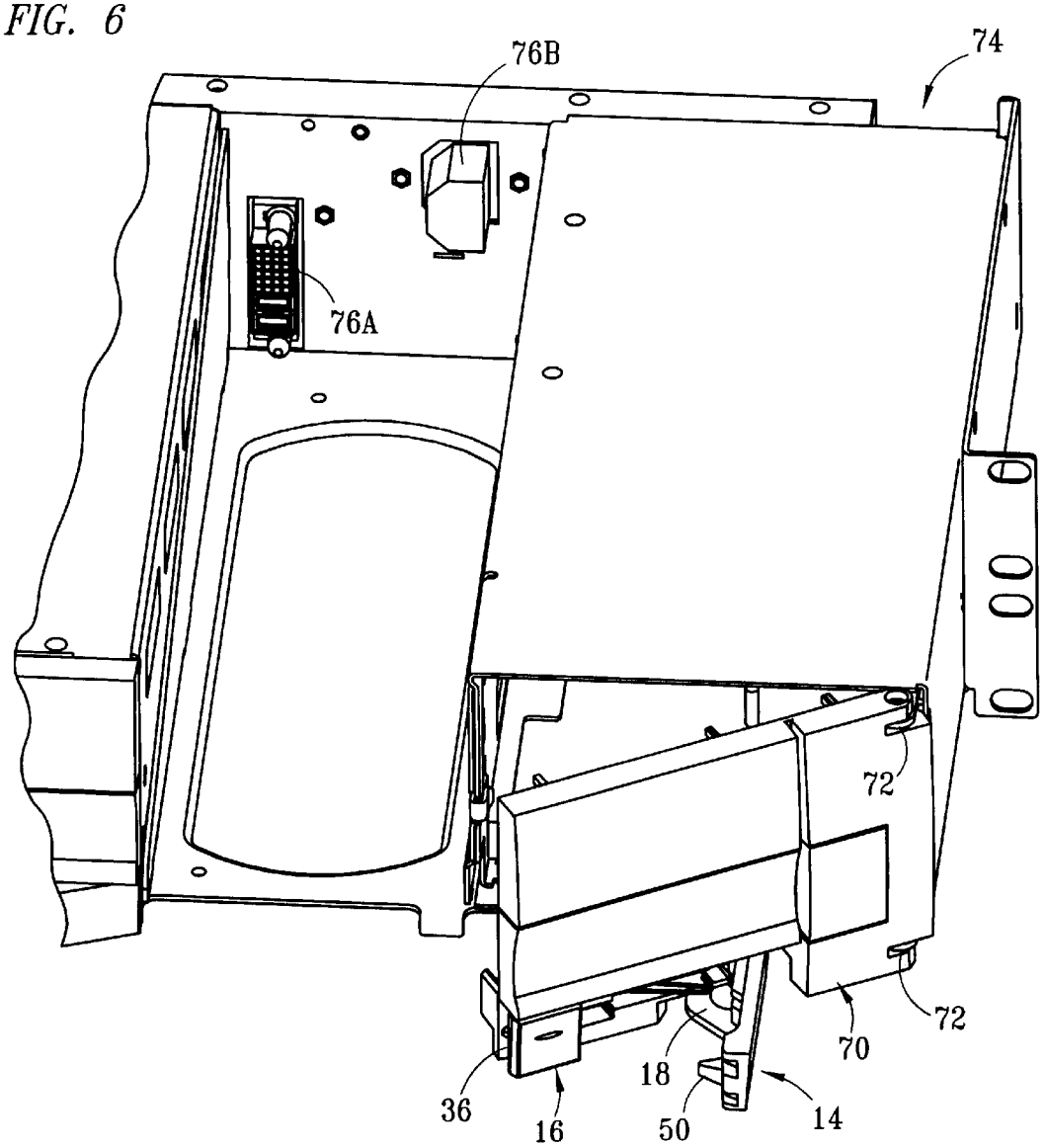
FIG. 6 illustrates the present invention as it may be used in conjunction with a hinged door for an enclosed space, such as a rack of equipment.

In FIG. 6, a door 70 is illustrated hinged or pivoted on pivot points or hinges 72 from a rack 74. While a projection 52, such as shown in FIG. 4, is not visible in this drawing, the insertion arm 18 or handle 14 will contact same for retaining the door 70 in position when the door 70 is closed and the handle 14 is latched. The actuation of the lock 16 at end 36 will likewise release handle 14 and allow the door 70 to be opened when outward pressure is applied to the finger pull 50. This drawing also shows electrical connection means 76A and 76B, in an open or unoccupied slot of rack 74, which may comprise many electrical pins or receptacles. The insertion and extraction principles of the present invention permit imparting the forces required to fully engage a large number of electrical connections as shown without damaging them.

In summary, the present invention comprises a handle which may be designed to be aesthetically pleasing, flush with other outer surfaces of a device using the handle, can provide insertion/extraction forces and may be easily locked to prevent opening due to outside forces, such as earthquake tremors.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It is therefore contemplated that the claims will cover any such modifications or embodiments that fall within the true scope and spirit of the invention.

What is claimed is:

1. A locking handle mechanism for closing and locking as well as unlocking and opening a door hinged from a housing, comprising:

a fulcrum pivoting handle lever arm pivotally movable about a fulcrum with respect to said door and having an outer surface, an inner surface, a first end resistance portion extending generally in a first direction from the fulcrum, a second end power applying portion extending generally in a direction opposite said first direction where the second end portion is farther from the fulcrum of the lever arm than is the first end portion and a first engagement element;

a finger pull on said power applying portion of said lever arm for using the handle in one of an opening mode;

a separate locking lever arm independently pivotable about a fulcrum including a second engagement element adapted to coactively engage with said first engagement element to retain said fulcrum pivoting handle lever arm in a closed condition and;

a lock maintaining spring for attempting to maintain said locking lever arm in a position with said first and second engagement elements in coacting engagement.

2. Apparatus as claimed in claim 1, comprising in addition:

a spring mechanism supplying opening power forces to said handle lever arm at a point between said fulcrum and said second end whereby the lever arm is encouraged toward an open position when unlocked.

3. A locking handle mechanism for closing and locking as well as unlocking and opening a handle disposed outside a component to be retained, comprising:

a fulcrum pivoting handle lever arm pivotable about a fulcrum and having an outer surface, an inner surface, a first end resistance portion extending generally in a first direction from the fulcrum; a second end power applying portion extending generally in a direction opposite said first direction where the second end portion is farther from the fulcrum of the lever arm than is the first end portion and a first engagement element;

a spring mechanism supplying opening power forces to said handle lever arm at a point between said fulcrum and said second end whereby the lever arm is encouraged toward an open position when unlocked;

a finger pull for using the handle in one of opening and extraction modes; and a separate locking lever arm independently pivotable about a fulcrum including a second engagement element adapted to coactively engage with said first engagement element to retain said fulcrum pivoting handle lever arm in a closed condition.

4. The mechanism of claim 3 wherein said locking lever arm has a resistance portion in close proximity to a fulcrum thereof and a power applying portion and including a lock maintaining spring for attempting to urge said power applying portion outwardly and mating engaging surfaces on said for maintaining said locking lever arm in a given position; the power applying portion being movable inwardly against the urging of said spring such that pressure applied to the power applying portion of the locking lever arm at a point on the outer surface thereof will move the locking lever arm to disengage said engaging surfaces whereby the handle is released from the locked position.

5. The mechanism of claim 3, comprising, in addition:
   an extraction arm comprising a part of said first end portion of said handle lever arm.

6. The mechanism of claim 3, comprising, in addition:
   an insertion arm comprising a part of said first end portion of said handle lever arm.

7. The mechanism of claim 3 operating as part of an electronic module to be inserted into and extracted from an enclosure and comprising, in addition:
   an enclosure adapted to receive at least one electronic module including an extraction force receiving surface; and
   an extraction arm comprising a part of said first end portion of said handle lever arm, said arm, upon movement of said handle toward an open position, operating in a levered cam type action, with respect to said extraction force receiving surface of said enclosure to extract said module from the enclosure.

8. The mechanism of claim 3 operating as part of an electronic module to be inserted into and extracted from an enclosure and comprising, in addition:
   an enclosure adapted to receive at least one electronic module including an insertion force receiving surface; and
   an insertion arm comprising a part of said first end portion of said handle lever arm, said arm, upon movement of said handle toward a locked position, operating in a levered cam type action, with respect to said insertion force receiving surface of said enclosure to insert said module into the enclosure.

9. The mechanism of claim 3 operating as part of an electronic module to be inserted into and extracted from an enclosure and comprising, in addition:
   an enclosure adapted to receive at least one electronic module including an insertion force receiving surface and an extraction force receiving surface;
   an insertion arm comprising a part of said first end portion of said handle lever arm, said arm, upon movement of said handle toward a locked position, operating in a levered cam type action, with respect to said insertion force receiving surface of said enclosure to insert said module into the enclosure; and
   an extraction arm comprising a part of said first end portion of said handle lever arm, said arm, upon movement of said handle toward an open position, operating in a levered cam type action, with respect to said extraction force receiving surface of said enclosure to extract said module from the enclosure, said extraction arm being disposed with respect to at least one portion of said enclosure when said handle is in a fully open position so as to prevent insertion of said module into the enclosure.

10. A handle mechanism for use with a module to be inserted into an opening in a rack whereby the rack includes a projection extending away from the opening for use by the locking handle mechanism, comprising:
    a fulcrum pivoting handle lever arm pivotable about a fulcrum and having a first end resistance portion extending generally in a first direction from the fulcrum; a second end power applying portion extending generally in a direction opposite said first direction and a first engagement element;
    a spring mechanism supplying opening power forces to said handle lever arm at a point between said fulcrum and said second end whereby the lever arm is encouraged toward a fully open position when unlocked; and
    a separate locking lever arm independently pivotable about a fulcrum and having a power applying portion in close proximity to a fulcrum thereof and a remote resistance portion including a lock maintaining spring for attempting to maintain said locking lever arm in a given position; said locking lever arm including a second engagement element located between said fulcrum thereof and said power applying portion adapted to coactively engage with said first engagement element to retain said fulcrum pivoting handle lever arm in a closed condition.

11. The mechanism of claim 10, comprising, in addition:
    an insertion arm comprising a part of said first end portion of said handle lever arm, said arm, upon movement of said handle toward a locked position, operating in a levered cam type action, with respect to said enclosure mounted projection, to forcibly insert said module into the enclosure.

12. The mechanism of claim 10, comprising, in addition:
    an insertion arm comprising a part of said first end portion of said handle lever arm which prevents the module from being extracted from said enclosure when said handle is in a locked position.

13. The mechanism of claim 10, comprising, in addition:
    an insertion arm comprising a part of said first end portion of said handle lever arm which prevents movement of the module within the enclosure in a direction perpendicular to the direction of movement of the handle when said handle is in a locked position.

14. The mechanism of claim 10, comprising, in addition:
    an insertion arm comprising a part of said first end portion of said handle lever arm which sandwiches an enclosure wall and thereby prevents movement of the module within the enclosure in a direction perpendicular the direction of insertion of the module.

15. A method of preventing insertion and extraction of an electronic module into an enclosure by other than an insertion/extraction handle comprising a part of the electronic module, comprising the steps of:
    forcibly maintaining an insertion/extraction handle, which handle is pivotable about a fulcrum and includes both insertion and extraction arms operating in a cam action with respect to a projection member of said enclosure toward a fully open position via spring action whenever said handle is unlatched from a locked position and a first engagement element;

positioning said extraction arm for contacting said projection member of said enclosure whereby said module is prevented from being inserted in said enclosure when said handle is in a fully open position;

positioning said insertion arm for contacting said projection member of said enclosure to position said insertion/extraction handle in a fully closed position; and locking said insertion/extraction handle in said fully closed position by means of a separate locking lever arm independently pivotable about a fulcrum including a second engagement element adapted to coactively engage with said first engagement element to retain said fulcrum pivoting handle lever arm in a closed condition whereby said module is prevented from being extracted from said enclosure when said handle is in said fully closed position.

16. A method of preventing movement of a module in an enclosure perpendicular to the direction of insertion of the module in the enclosure, comprising the steps of:

providing an enclosure projection member perpendicular to a wall of the enclosure and extending away from said enclosure;

providing a levered handle having an insertion arm upon a module to be inserted into the enclosure and positioning said insertion arm for contacting said projection member of said enclosure at a point outside the wall of said enclosure as part of the insertion process whereby said module is prevented by said insertion arm from moving in said perpendicular direction toward said insertion arm.

17. A method of preventing movement of a module in an enclosure in a direction opposite to the direction of insertion of the module in the enclosure, comprising the steps of:

providing an enclosure projection member substantially perpendicular to a wall of the enclosure;

providing a levered handle pivotable about a fulcrum and having an insertion arm upon a module to be inserted into the enclosure and a first engagement element;

positioning said insertion arm for contacting said projection member of said enclosure as part of the insertion process; and locking said handle into a closed position by means of a separate and independently pivotable locking lever arm including a second engagement element adapted to coactively engage with said first engagement element to retain said fulcrum pivoting handle lever arm in a closed condition when the module is fully inserted whereby said module is prevented movement in said direction opposite to the direction of insertion.

18. An insertion/extraction mechanism for preventing insertion and extraction of an electronic module into an enclosure by other than an insertion/extraction handle comprising a part of the electronic module, comprising:

an enclosure mounted projection;

an insertion/extraction handle, which handle includes both insertion and extraction arms operating in a cam action, with respect to said enclosure mounted projection, to respectively apply insertion and extraction forces to the module with respect to the enclosure;

a spring mechanism operable to normally maintain said handle toward a fully open position whenever said handle is unlatched from a locked position, the extraction arm being configured to contact said projection member of said enclosure when the handle is in a fully open position whereby said module is prevented from being inserted in said enclosure and said insertion arm being configured for contacting said projection member of said enclosure when said handle is in a locked position whereby said module is prevented from being extracted from said enclosure.

19. A flush mounted container insertion/extraction mechanism, comprising:

an enclosure;

a container requiring at least one of substantial insertion and extraction forces to be correctly inserted and/or extracted from said enclosure;

a faceplate having an exposed surface;

a handle lever arm pivotally movable with respect to said faceplate having an outer surface substantially conforming to said exposed surface, an inner surface and first and second ends extending in opposite directions from a fulcrum point, the outer surface of said lever arm being substantially coplanar with the exposed surface of said faceplate when said handle lever arm is in a locked position;

pivotal means attaching said handle lever arm to said door via said fulcrum point;

spring means interconnected to said handle lever arm to provide resistance to the handle lever arm being moved to the locked position;

a finger pull on said handle lever arm near said second end thereof for aiding the full extraction of the container from said enclosure;

a locking lever arm, co-acting with said handle lever arm to maintain said locking lever arm in a locked position upon power forces being applied to the outer surface of said second end of said handle lever arm, an outer surface of said locking lever arm normally being substantially coplanar with the exposed surface of said door when in a locked position.

20. A flush mounted container insertion/extraction mechanism, comprising:

a module to be inserted in an enclosure;

a pivoting lockable handle, one surface of which is flush with said outer facing when said handle is in a locked position;

a separate and independently pivotable locking mechanism that is normally flush with said outer facing and said one surface of said handle except when said handle is being locked or has been released from the locked position.

21. The apparatus of claim 20, comprising, in addition:

an insertion arm comprising part of said lockable handle, operating in a cam mode with respect to a projection of said enclosure, whereby the module is caused to be fully inserted as the handle is moved to a locked position.

22. The apparatus of claim 20, comprising, in addition:

an extraction arm comprising part of said lockable handle, operating in a cam mode with respect to a projection of said enclosure, whereby the module is caused to be forcibly extracted as the handle is moved from a locked position to a fully open position.

23. The apparatus of claim 20, comprising, in addition:

spring means for raising said handle to a partially open position when said handle is released from said locked position;

an extraction arm comprising part of said lockable handle;

a finger pull projection comprising a part of said handle, the module extraction process being aided by outward forces applied to the finger pull projection.

24. The apparatus of claim 20, comprising, in addition:

extraction and insertion arms comprising part of said lockable handle, said arms, in combination with a projection of said enclosure, preventing the extraction and the insertion of the module in the enclosure by any means other than movement of said handle between open and closed positions.

25. The method of claim 17 wherein the enclosure projection member extends from said enclosure.

26. The method of claim 17 wherein the enclosure projection member extends into said enclosure.

27. A flush mounted container insertion/extraction mechanism, comprising:

a module to be inserted in an enclosure;

a lockable handle, one surface of which is flush with said outer facing when said handle is in a locked position;

a locking mechanism that is normally flush with said outer facing and said one surface of said handle except when said handle is being locked or has been released from the locked position;

spring means for raising said handle to a partially open position when said handle is released from said locked position;

an extraction arm comprising part of said lockable handle; and a finger pull projection comprising a part of said handle, the module extraction process being aided by outward forces applied to the finger pull projection.

* * * * *

UNITED STATES PATENT AND TRADEMARK OFFICE
CERTIFICATE OF CORRECTION

PATENT NO. : 6,680,851 B1
DATED : January 20, 2004
INVENTOR(S) : Fasullo et al.

It is certified that error appears in the above-identified patent and that said Letters Patent is hereby corrected as shown below:

Column 4,
Line 47, delete "handle lever arm in a closed condition and;" and insert -- handle lever arm in a closed condition; and --

Column 5,
Line 16, delete "on said"

Column 6,
Line 17-18, delete "from the fulcrum; a second" and insert -- from the fulcrum, a second--

Column 7,
Line 29, delete "into the enclosure and" and insert -- into the enclosure; and --
Line 64, following "with respect to the enclosure;" add -- and --

Column 8,
Line 32, following "from said enclosure;" add -- and --
Line 42, following "a module to be inserted in an enclosure;" add -- a faceplate including an outer facing that can still be seen when said module is fully inserted in an enclosure; --
Line 45, following "position;" add -- and --
Line 47, delete "that is" and insert -- engageable with said pivoting lockable handle, said pivotable locking mechanism being --
Line 48, delete "said one surface of said handle except when said handle" and insert -- said one surface of said pivoting lockable handle except when said pivoting lockable handle --

UNITED STATES PATENT AND TRADEMARK OFFICE
CERTIFICATE OF CORRECTION

PATENT NO. : 6,680,851 B1
DATED : January 20, 2004
INVENTOR(S) : Fasullo et al.

It is certified that error appears in the above-identified patent and that said Letters Patent is hereby corrected as shown below:

Column 9,
Line 1, following "part of said lockable handle; add -- and --

Signed and Sealed this

Sixteenth Day of November, 2004

JON W. DUDAS
*Director of the United States Patent and Trademark Office*